United States Patent
Okita

(10) Patent No.: US 6,825,076 B2
(45) Date of Patent: Nov. 30, 2004

(54) METHOD OF MANUFACTURING THE FERAM SEMICONDUCTOR DEVICE WITH IMPROVED CONTACT PLUG STRUCTURE

(75) Inventor: Yoichi Okita, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/767,179

(22) Filed: Jan. 30, 2004

(65) Prior Publication Data

US 2004/0183112 A1 Sep. 23, 2004

Related U.S. Application Data

(62) Division of application No. 10/269,060, filed on Oct. 11, 2002, now Pat. No. 6,720,600.

(30) Foreign Application Priority Data

Feb. 15, 2002 (JP) .......................................... 2002-38550

(51) Int. Cl.⁷ .......................................... H01L 21/8242
(52) U.S. Cl. ........................ 438/239; 438/240; 438/253
(58) Field of Search ............................ 438/3, 239, 240, 438/253, 254, 396, 397

(56) References Cited

U.S. PATENT DOCUMENTS

| 5,990,507 A | 11/1999 | Mochizuki et al. ......... 257/295 |
| 6,165,839 A * | 12/2000 | Lee et al. .................... 438/253 |
| 6,485,988 B2 | 11/2002 | Ma et al. ....................... 438/3 |

FOREIGN PATENT DOCUMENTS

JP 10-303398 11/1998

* cited by examiner

*Primary Examiner*—Hoai Pham
(74) *Attorney, Agent, or Firm*—Westerman, Hattori, Daniels & Adrian, LLP

(57) ABSTRACT

There is provided a semiconductor device having a ferroelectric capacitor, which comprises capacitor protection films for covering an upper surface and a side surface the ferroelectric capacitor that is formed on a first insulating film, a hole formed in a second insulating film, which is formed on the capacitor protection films and the first insulating film, to be positioned adjacently to the side surface of the ferroelectric capacitor via the capacitor protection films, and a conductive plug formed in the hole. Accordingly, alignment margin of the contact hole to be formed next to the capacitor can be reduced.

10 Claims, 14 Drawing Sheets

METHOD OF MANUFACTURING THE FERAM SEMICONDUCTOR DEVICE WITH IMPROVED CONTACT PLUG STRUCTURE

This application is a divisional application of prior application Ser. No. 10/269,060 filed Oct. 11, 2002 now U.S. Pat. No. 6,720,600.

CROSS-REFERENCE TO RELATED APPLICATIONS

This application is based upon and claims priority of Japanese Patent Application No. 2002-38550, filed in Feb. 15, 2002, the contents being incorporated herein by reference.

BACKGROUND OF THE INVENTION

1. Field of the Invention

The present invention relates to a semiconductor device and a method of manufacturing the same and, more particularly, a semiconductor device having a ferroelectric capacitor and a method of manufacturing the same.

2. Description of the Prior Art

As the nonvolatile memory that still stores the information when the power supply is turned off, the ferroelectric random access memory (FeRAM) is known.

The FeRAM has a memory cell that stores the information using the hysteresis characteristic of the ferroelectric capacitor. The ferroelectric capacitor has the structure in which a ferroelectric film is formed between a pair of electrodes. In the ferroelectric capacitor, the polarization is generated in response to the magnitude of the voltage applied between the electrodes, and the spontaneous polarization is kept even when the applied voltage is removed. If the polarity of the applied voltage is reversed, the polarity of the spontaneous polarization is also reversed. Then, the information can be read by sensing the spontaneous polarization.

As the FeRAM memory cell, the 1T/1C type that uses one transistor and one capacitor to store 1-bit information and the 2T/2C type that uses two transistors and two capacitors to store 1-bit information are present. The 1T/1C type memory cell can reduce the cell area and achieve the higher integration in contrast to the 2T/2C type memory cell.

Next, steps of forming the 1T/1C type memory cell having the stacked capacitor is explained hereunder.

First, steps required to get a structure shown in FIG. 1A is explained.

An element isolation insulating film 102 is formed around an element forming region of a silicon substrate 101, and then a well 103 is formed in the element forming region. Then, two MOS transistors 104 are formed in the well 103.

The MOS transistor 104 has a gate electrode 104b formed on the well 103 via a gate insulating film 104a, and impurity diffusion regions 104c, 104d formed in the well 103 on both sides of the gate electrode 104b and serving as source/drain regions. Also, insulating sidewalls 105 used to form high impurity concentration regions 104d in the impurity diffusion regions 104c are formed on both side surfaces of the gate electrode 104b.

Then, a transistor protection insulating film 106 for covering the MOS transistors 104 is formed on the silicon substrate 101, and then a first interlayer insulating film 107 is formed on the transistor protection insulating film 106.

Then, first contact hole 107a are formed in the first interlayer insulating film 107 on one impurity diffusion regions 104c of the MOS transistors 104, and then first contact plugs 108 are buried in the first contact hole 107a.

Then, a first metal film 109, a ferroelectric film 110, and a second metal film 111 are formed sequentially on the first contact plugs 108 and the first interlayer insulating film 107.

Then, as shown in FIG. 1B, capacitors 112 are formed by patterning the first metal film 109, the ferroelectric film 110, and the second metal film 111 by virtue of the photography method. In the capacitor 112, the first metal film 109 is used as a lower electrode 109a, the ferroelectric film 110 is used as a dielectric film 110a, and the second metal film 111 is used as an upper electrode 111a. The capacitor 112 is the stacked type capacitor, and the lower electrode 109a is connected to one impurity diffusion layer 104c of the MOS transistor 104 via the underlying first contact plug 108.

Then, as shown in FIG. 1C, a single-layer capacitor protection film 113 is formed only once on the capacitors 112 and the first interlayer insulating film 107, then a second interlayer insulating film 114 is formed on the capacitor protection film 113, and then a second contact hole 114a is formed on the other impurity diffusion region 104d of the MOS transistors 104 by patterning the second interlayer insulating film 114, the capacitor protection film 113, the first interlayer insulating film 107, and the transistor protection insulating film 106 by virtue of the photolithography method. Then, a second contact plug 115 is formed in the second contact hole 114a.

Next, steps required to form a structure shown in FIG. 1D will be explained hereunder.

Third contact holes 114b are formed on the upper electrodes 110a of the capacitors 112 by patterning the second interlayer insulating film 114. Then, a conductive film is formed on the second interlayer insulating film 114 and in the third contact holes 114b. Then, this conductive film is pattern to form wirings 116a, which are connected to the upper electrodes 111a of the capacitors 112, and at the same time to form a conductive pad 116b on the second contact plug 115.

Then, a third interlayer insulating film 117 for covering the wirings 116a and the conductive pad 116b is formed on the second interlayer insulating film 114. Then, a hole 117a is formed on the conductive pad 116b by patterning the third interlayer insulating film 117, and then a fourth conductive plug 118 is formed in the hole 117a.

Then, a bit line 119 that is connected to the conductive plug 118 is formed on the third interlayer insulating film 117.

An arrangement of the MOS transistors, the capacitors, and the word line in the 1T/1C type memory cell, as described above, is given in a plan view of FIG. 2. In this case, FIG. 1D is a sectional view taken along a I—I line in FIG. 2.

By the way, when the second contact hole 114a is opened in the first and second interlayer insulating films 107, 114, the alignment margin is required to prevent the contact of the second contact hole 114a to the capacitors 112. In this case, the second contact hole 114a must be separated from the capacitors 112 to such extent that the alignment margin can be assured. Accordingly, an interval between two capacitors 112 that are positioned adjacently over the well 103 is decided.

Unless such alignment margin is assured, it is possible that the second contact hole 114a overlaps with a part of the capacitors 112.

If the second contact hole 114a is formed to come into contact with the capacitors 112, the second contact plug 115 in the second contact hole 114a is short-circuited to the capacitors 112. Also, if the second contact hole 114a comes into contact with the capacitors 112, there is a possibility that, when the second contact plug 115 is formed by the CVD method, the ferroelectric film 110 is reduced by the reaction gas and thus the ferroelectric film 110 of the capacitor is degraded.

Also, if the area of the capacitor 112 is reduced to achieve the higher integration of the memory cell, the memory cell characteristic is ready to degrade.

SUMMARY OF THE INVENTION

It is an object of the present invention to provide a semiconductor device having a structure that is capable of reducing an alignment margin of a contact hole formed next to a capacitor, and a method of manufacturing the same.

The above subjects can be overcome by providing a semiconductor device that comprises a first impurity diffusion region formed in a semiconductor substrate; a first insulating layer formed over the semiconductor substrate; a capacitor formed on the first insulating layer and having a lower electrode, a ferroelectric layer, and an upper electrode; an insulating capacitor protection layer made of material that is different from the first insulating layer, for covering an upper surface and a side surface of the capacitor; a second insulating layer formed on the capacitor protection layer and the first insulating layer, and made of material that can be etched selectively from the capacitor protection layer; a first hole formed in the second insulating layer and positioned next to the side surface of the capacitor via the capacitor protection layer; and a first conductive plug formed in the first hole and connected electrically to the first impurity diffusion region.

Also, the above subjects can be overcome by providing a semiconductor device manufacturing method that comprises the steps of forming a first impurity diffusion region in a semiconductor substrate; forming a first insulating layer over the semiconductor substrate; forming a first conductive layer, a ferroelectric layer, and a second conductive layer on the first insulating layer; forming a capacitor by patterning the second conductive layer, the ferroelectric layer, and the first conductive layer using a first mask; forming an insulating capacitor protection layer made of material, which is different from the first insulating layer, on an upper surface and side surfaces of the capacitor; forming a second insulating layer made of material, that can be etched selectively from the capacitor protection layer, on the capacitor protection layer and the first insulating layer; forming a first hole, which comes into contact with the capacitor protection layer on the side surface of the capacitor, in the second insulating layer; and forming a first conductive plug, which is connected electrically to the first impurity diffusion region, in the first hole.

According to the semiconductor device of the present invention, there are provided the capacitor protection film for covering the upper surface and the side surface of the ferroelectric capacitor that is formed on the first insulating film, the hole formed in the second insulating film, which is formed on the capacitor protection film and the first insulating film, to be positioned adjacently to the side surface of the ferroelectric capacitor via the capacitor protection film, and the conductive plug formed in the hole.

Accordingly, the interval between the ferroelectric capacitor and the conductive plug is set equally to the thickness of the capacitor protection film, and thus the capacitor area is widened rather than the prior art because the forming area of the ferroelectric capacitor approaches the hole.

Also, according to the semiconductor device manufacturing method of the present invention, there are provided the steps of covering the upper surface and the side surface of the ferroelectric capacitor, that is formed on a first insulating film, with the capacitor protection film, then forming a second insulating film made of material, which can be etched selectively from the capacitor protection films, on the capacitor protection films and the first insulating film, then forming the hole in a second insulating film to come into contact with the capacitor protection film, and then forming the conductive plug in the hole.

Accordingly, in the step of forming the hole in the second insulating film, the hole is positioned in a self-alignment while using the capacitor protection film on the surface of the ferroelectric capacitor. Therefore, it is not necessary to secure the alignment margin to form the hole widely in advance, and the formation of the hole is facilitated, and the formation region of the ferroelectric capacitor is extended toward the hole by positioning the hole closer to the capacitor than the prior art.

In this case, the capacitor protection film consists of the material which prevents the capacitor from the reduction, and which etches the insulating film selectively to the capacitor protection film.

DESCRIPTION OF THE PREFERRED EMBODIMENTS

Embodiments of the present invention will be explained with reference to the accompanying drawings hereinafter.

FIGS. 3A to 3M are sectional views showing steps of manufacturing a semiconductor device according to an embodiment of the present invention. FIG. 4 is a plan view showing an arrangement of transistors and capacitors in a memory cell region of the semiconductor device according to the embodiment of the present invention.

First, steps required to form a sectional structure shown in FIG. 3A will be explained hereunder.

Figure 3A:
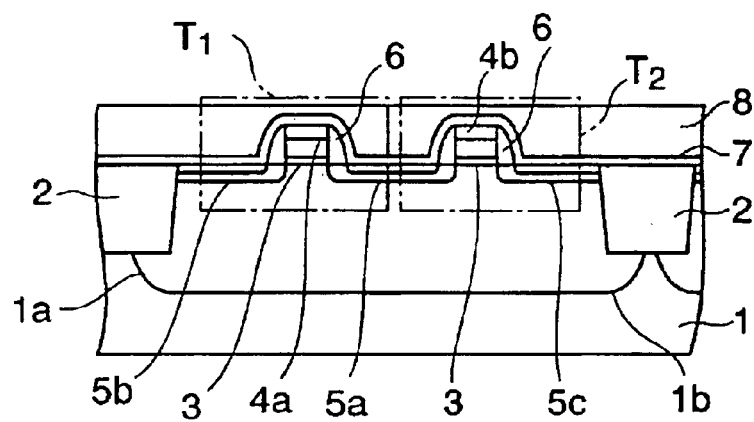
FIGS. 3A to 3M are sectional views showing steps of manufacturing a semiconductor device according to an embodiment of the present invention.
Figure 4:
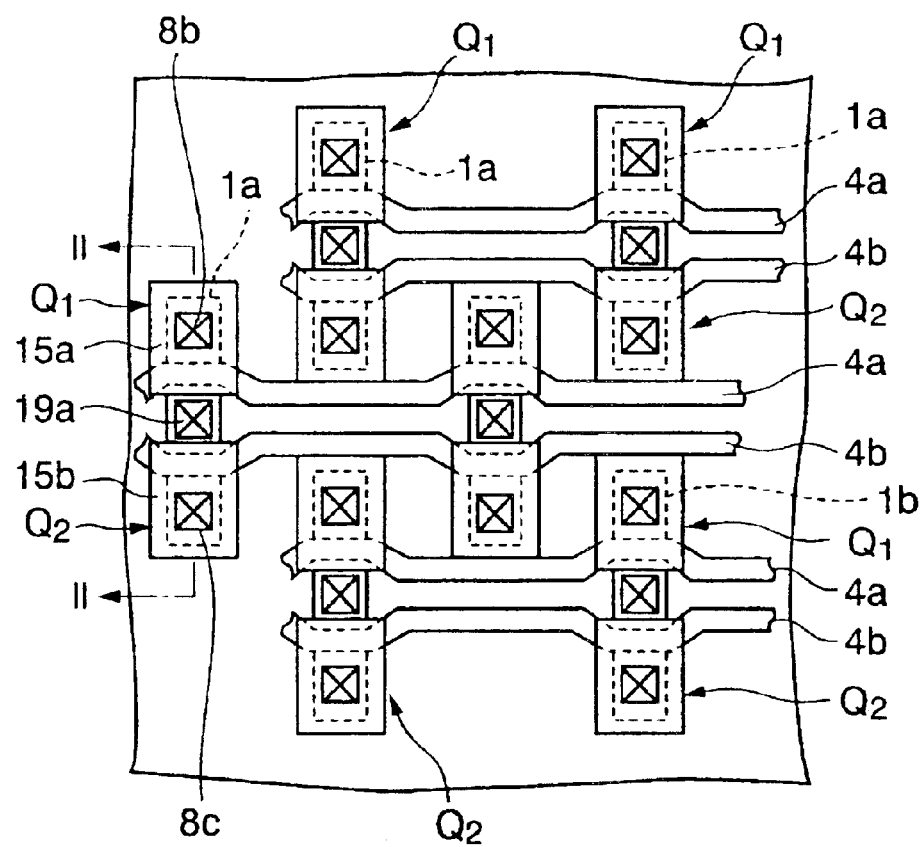
FIG. 4 is a plan view showing an arrangement of transistors and capacitors in a memory cell region of the semiconductor device according to the embodiment of the present invention.

As shown in FIG. 3A, an element isolation recess is formed around a transistor forming region of an n-type or p-type silicon (semiconductor) substrate 1 by the photolithography method, and then an element isolation insulating film 2 is formed by burying silicon ($SiO_2$) in the element isolation recess. The element isolation insulating film 2 having such structure is called STI (Shallow Trench Isolation). In this case, an insulating film formed by the LOCOS (Local Oxidation of Silicon) method may be employed as the element isolation insulating film.

Then, a p-type well 1a is formed by introducing the p-type impurity into the transistor forming region of the silicon substrate 1 in the memory cell region.

Then, a silicon oxide film serving as a gate insulating film 3 is formed by thermally annealing a surface of the p-type well 1a on the silicon substrate 1.

Then, an amorphous silicon film or a polysilicon film and a tungsten silicide film are formed sequentially on the overall upper surface of the silicon substrate 1. Then, gate electrodes 4a, 4b are formed on the well 1a in the memory cell region by patterning the silicon film and the tungsten silicide film by means of the photolithography method. These gate electrodes 4a, 4b are formed on the silicon substrate 1 via the gate insulating film 3.

In this case, in the memory cell region, two gate electrodes 4a, 4b are formed in parallel on one p-type well 1a and these gate electrodes 4a, 4b constitute a part of the word line.

Then, first to third n-type impurity diffusion regions 5a to 5c serving as source/drain regions are formed by ion-implanting the n-type impurity, e.g., phosphorus, into the p-type well 1a on both sides of the gate electrodes 4a, 4b.

Then, an insulating film, e.g., silicon oxide ($SiO_2$) film is formed on the overall surface of the silicon substrate 1 by the CVD method, and then the insulating film is etched back to be left on both side portions of the gate electrodes 4a, 4b as insulating sidewall spacers 6.

Then, high impurity concentration regions are formed in the first to third n-type impurity diffusion regions 5a to 5c respectively by ion-implanting the n-type impurity into the first to third n-type impurity diffusion regions 5a to 5c again while using the gate electrodes 4a, 4b and the sidewall spacers 6 as a mask in the p-type well 1a.

In one p-type well 1a, the first n-type impurity diffusion region 5a formed between two gate electrodes 4a, 4b is connected electrically to the bit line, described later, and the second and third n-type impurity diffusion regions 5b, 5c formed near both ends of the well 1a are connected electrically to the lower electrodes of the capacitors, described later.

According to above steps, two n-type MOS transistors $T_1$, $T_2$ that have the gate electrodes 4a, 4b and the n-type impurity diffusion regions 5a to 5c having the LDD structure are formed in the p-type well 1a to have one n-type impurity diffusion region 5a commonly.

Then, a silicon oxide nitride (SiON) film of about 200 nm thickness is formed as a cover insulating film 7, which covers the MOS transistors $T_1$, $T_2$, on the overall surface of the silicon substrate 1 by the plasma CVD method. Then, a silicon oxide ($SiO_2$) film of about 1.0 μm thickness is formed on the cover insulating film 7 as a first interlayer insulating film 8 by the plasma CVD method using the TEOS gas.

Then, the first interlayer insulating film 8 is annealed at the temperature of 700° C. for 30 minutes in the nitrogen atmosphere at the normal pressure, for example, whereby the first interlayer insulating film 8 is densified. Then, an upper surface of the first interlayer insulating film 8 is planarized by the chemical mechanical polishing (CMP) method.

Figure 3B:
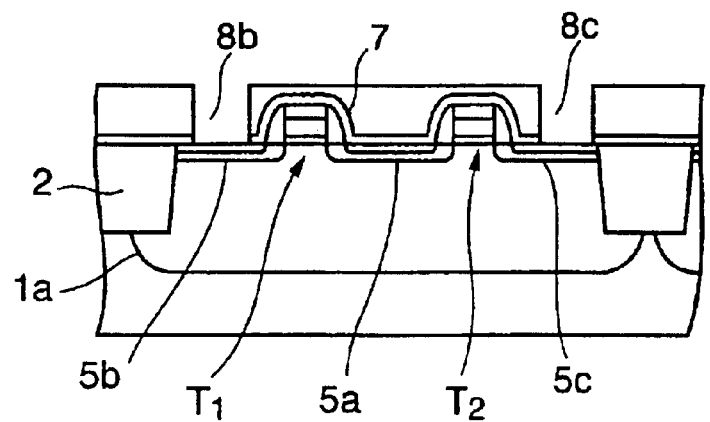

Then, as shown in FIG. 3B, the first interlayer insulating film 8 and the cover insulating film 7 are etched while using the resist pattern (not shown). Thus, first and second contact holes 8b, 8c are formed on the second and third n-type impurity diffusion regions 5b, 5c in the memory region respectively.

Figure 3C:
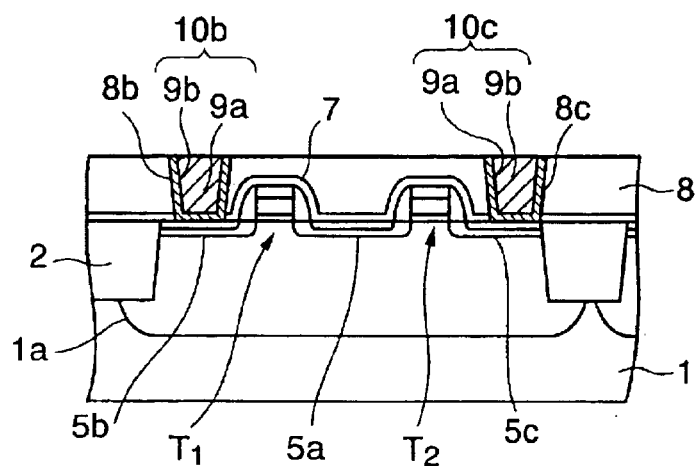

Next, steps required to form a structure shown in FIG. 3C will be explained hereunder.

First, a titanium nitride (TiN) film of 50 nm thickness is formed as a glue film 9a on the first interlayer insulating film 8 and in the first and second contact holes 8b, 8c by the sputter method. Then, insides of the contact holes 8b, 8c are buried completely by growing a tungsten (W) film 9b on the glue film 9a by virtue of the CVD method using $WF_6$.

Then, the tungsten film 9b and the glue film 9a are polished by the CMP method to be removed from an upper surface of the first interlayer insulating film 8. Accordingly, the tungsten film 9b and the glue film 9a left in the first and second contact holes 8b, 8c are used as first and second conductive plugs 10b, 10c that are connected to the second and third n-type impurity diffusion regions 5b, 5c.

Figure 3D:
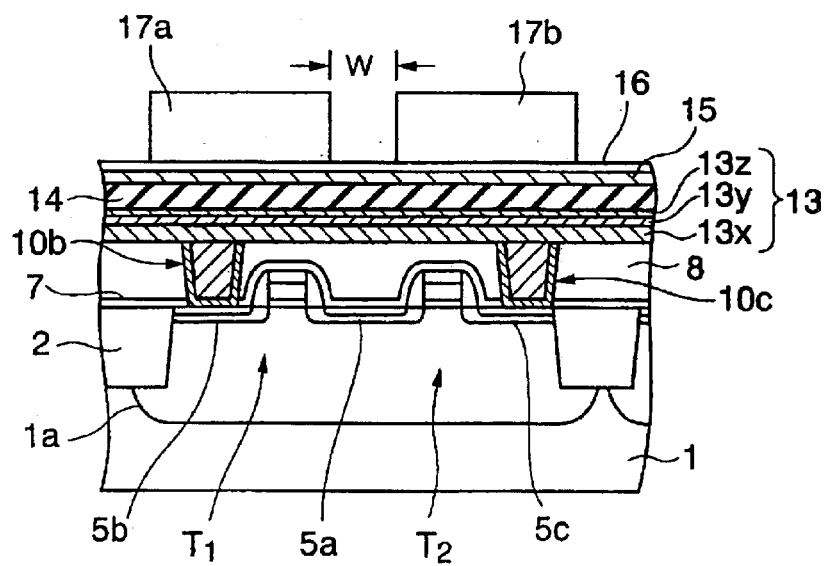

Next, steps required to form a structure shown in FIG. 3D will be explained hereunder.

First, an iridium (Ir) film 13a of 200 nm thickness, a platinum oxide (PtO) film 13b of 23 nm thickness, and a platinum (Pt) film 13c of 50 nm thickness, for example, are formed in sequence as a first conductive film 13 on the first and second conductive plugs 10b, 10c and the first interlayer insulating film 8 by the sputter.

In this case, an upper surface of the first interlayer insulating film 8 is annealed before or after the formation of the first conductive film 13 to prevent the peeling-off of the film, for example. As the annealing method, for example, RTA (Rapid Thermal Annealing) executed in the argon atmosphere at 600 to 750° C. is employed.

Then, a PZT film of 200 nm thickness, for example, is formed on the first conductive film 13 as a ferroelectric film 14 by the sputter method. As the method of forming the ferroelectric film 14, in addition to this, there are the MOD (Metal Organic Deposition) method, the MOCVD (Metal Organic CVD) method, the sol-gel method, and others. Also, as the material of the ferroelectric film 14, in addition to PZT, the PZT material such as PLCSZT, PLZT, etc., the Bi-layer structure compound material such as $SrBi_2Ta_2O_9$, $SrBi_2(Ta,Nb)_2P_9$, etc., and other metal-oxide ferroelectrics may be employed.

Then, the ferroelectric film 14 is crystallized by executing the annealing in the oxygen-containing atmosphere. As such annealing, two-step RTA process having the first step, which executes the annealing at the substrate temperature of 600° C. for 90 seconds in the mixed gas atmosphere consisting of argon (Ar) and oxygen ($O_2$), and the second step, which executes the annealing at the substrate temperature of 750° C. for 60 seconds in the oxygen atmosphere, for example, is employed.

In addition, an iridium oxide ($IrO_2$) film of 200 nm thickness, for example, is formed on the ferroelectric film 14 as a second conductive film 15 by the sputter method. Also, a first capacitor protection film 16 made of alumina having a thickness of about 170 nm, for example, is formed on the second conductive film 15. As the first capacitor protection film 16, PZT material such as the PZT film, the PLZT film, etc., titanium oxide, and other reduction preventing material may be used in place of the alumina.

Then, a TiN film and an $SiO_2$ film are sequentially formed as hard films on the first capacitor protection film 16 over the p-type well 1a and its periphery, and then such hard films are patterned by the photolithography method. Thus, first and second hard masks 17a, 17b are formed at a distance over one p-type well 1a to form the capacitors.

The first and second hard masks 17a, 17b have capacitor planar shapes that overlap with upper surfaces of the first and second conductive plugs 10b, 10c. Also, an interval w between the first and second hard masks 17a, 17b over one p-type well 1a is set to a value that is obtained by adding a magnitude that is twice the thickness of the second capacitor protection film, described later, to a diameter of the third conductive plug that is to be formed on the first n-type impurity diffusion region 5a and described later.

Figure 3E:
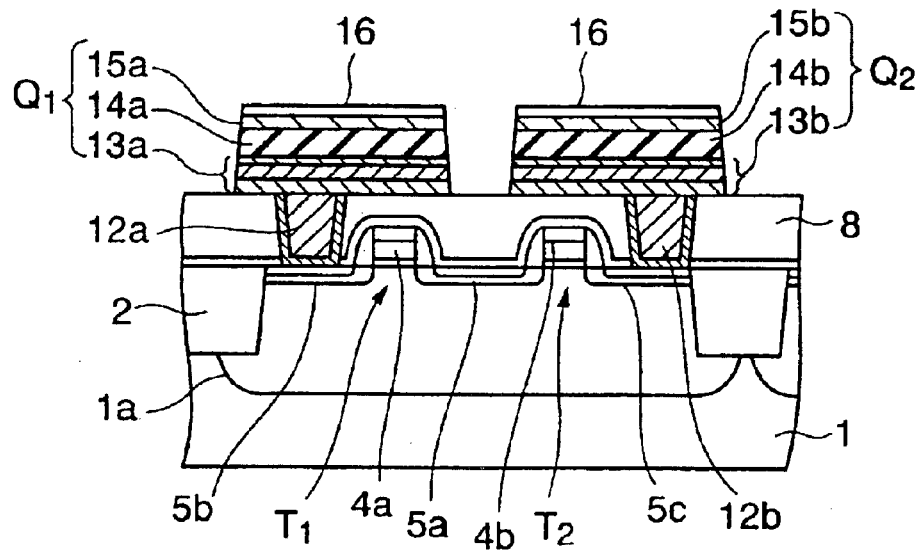

Then, first and second capacitors $Q_1$, $Q_2$ are formed on the first interlayer insulating film 8 by sequentially etching the first capacitor protection film 16, the second conductive film 15, the ferroelectric film 14, and the first conductive film 13 in the region that is not covered with the first and second hard masks 17a, 17b. Then, the state shown in FIG. 3E is brought about by removing the hard mask 16.

The first and second capacitors $Q_1$, $Q_2$ consist of lower electrodes 13a, 13b each formed of the first conductive film 13, capacitor dielectric films 14a, 14b each formed of the ferroelectric film 14, and upper electrodes 15a, 15b each formed of the second conductive film 15. In this case, the upper electrodes 15a, 15b are covered with the first capacitor protection film 16. Also, the lower electrode 13a of the first capacitor $Q_1$ is connected electrically to the second n-type impurity diffusion region 5b via the first conductive plug 12a, while the lower electrode 13b of the second capacitor $Q_2$ is connected electrically to the third n-type impurity diffusion region 5c via the second conductive plug 12b.

Here, the capacitors $Q_1$, $Q_2$ have sizes to cover the gate electrodes 4a, 4b of the conductive plugs 12a, 12b, and also centers of the lower electrodes 13a, 13b are deviated from the conductive plug 12a, 12b to the gate electrodes 4a, 4b side. Also, the first capacitor $Q_1$ and the second capacitor $Q_2$ are formed on one p-type well 1a such that a space between these capacitors is positioned just over the first n-type impurity diffusion region 5a. It is preferable that, in view of the displacement of such space, the space between the first and second capacitors $Q_1$, $Q_2$ should be designed smaller than the interval between two gate electrodes 4a, 4b over the p-type well 1a.

Then, in order to recover the ferroelectric film 14 from the etching damage, the recovery annealing is carried out. In this case, the recovery annealing is carried out in the furnace containing the oxygen at the substrate temperature of 650° C. for 60 minutes, for example.

Figure 3F:
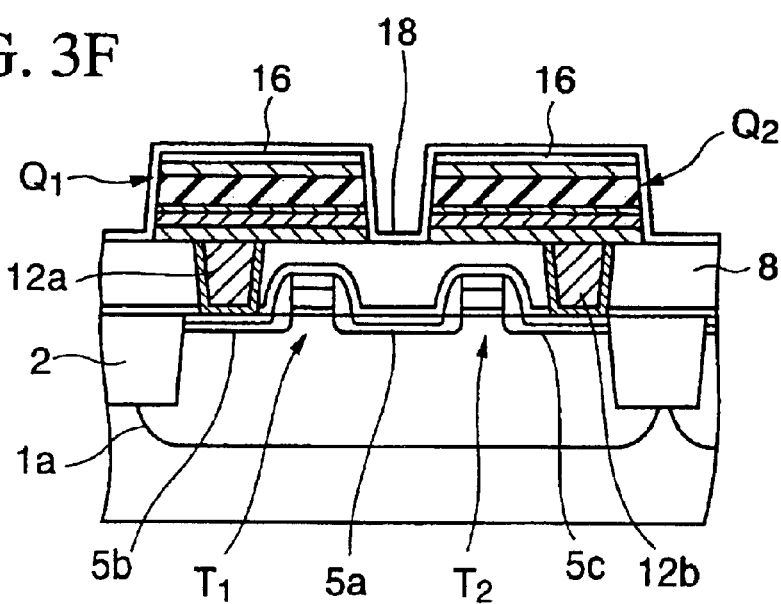

Then, as shown in FIG. 3F, a second capacitor protection film 18 made of alumina having a thickness of 50 to 150 nm is formed on the first interlayer insulating film 8 by the sputter method or the MOCVD method to cover the capacitors $Q_1$, $Q_2$. Accordingly, the capacitor protection films 16, 18 having a total thickness of about 220 to 320 nm are formed on the upper electrodes 15a, 15b of the capacitors $Q_1$, $Q_2$. In this case, since side walls of the capacitors $Q_1$, $Q_2$ have a sharp inclination, the thickness of the second capacitor protection film 18 that covers these side walls becomes 25 to 135 nm. The capacitor protection films 16, 18 protect the capacitors $Q_1$, $Q_2$ from the process damage, and may be formed of PZT material, the reduction preventing material such as titanium oxide, etc. in addition to alumina.

Then, the capacitors $Q_1$, $Q_2$ are annealed in the oxygen containing atmosphere at 650° C. for 60 minutes.

Figure 3G:
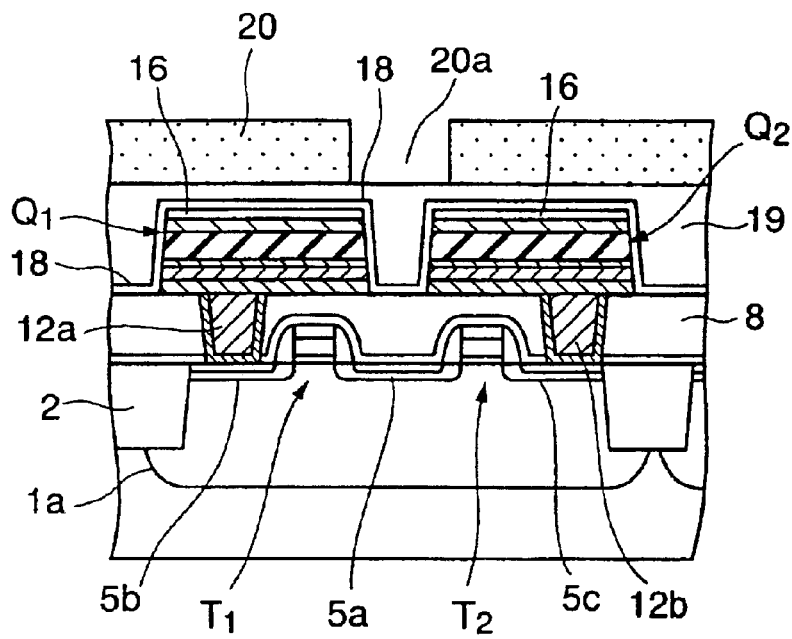

Next, steps required to form a structure shown in FIG. 3G will be explained hereunder.

First, a silicon oxide ($SiO_2$) of about 1.0 μm thickness is formed as a second interlayer insulating film 19 on the second capacitor protection film 18 and the first interlayer insulating film 8 by the plasma CVD method using the TEOS gas. Then, an upper surface of the second interlayer insulating film 19 is planarized by the CMP method. In this example, a remaining thickness of the second interlayer insulating film 19 after the CMP is set to about 300 nm over the upper electrodes 15a, 15b, and is set to about 300 nm over the first interlayer insulating film 8 on the side of the capacitors $Q_1$, $Q_2$.

Then, a resist 20 is coated on the second interlayer insulating film 19, and then an opening portion 20a used to form a contact hole between the first and second capacitors $Q_1$, $Q_2$, which are positioned adjacently on one p-type well 1a, is formed by exposing/developing the resist 20. In light of the alignment displacement, this opening portion 20a may be formed to have a diameter larger than the interval between the capacitors $Q_1$, $Q_2$.

Figure 3H:
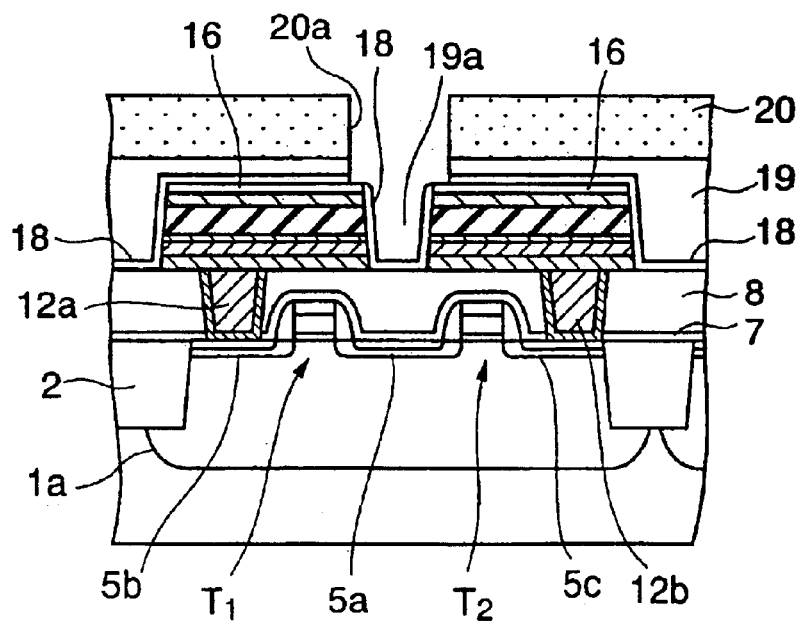

Then, as shown in FIG. 3H, an upper portion of a third contact hole 19a is formed by applying vertically the anisotropic etching to the second interlayer insulating film 19 while using the fluorine reaction gas via the opening portion 20a in the resist 20.

Figure 3I:
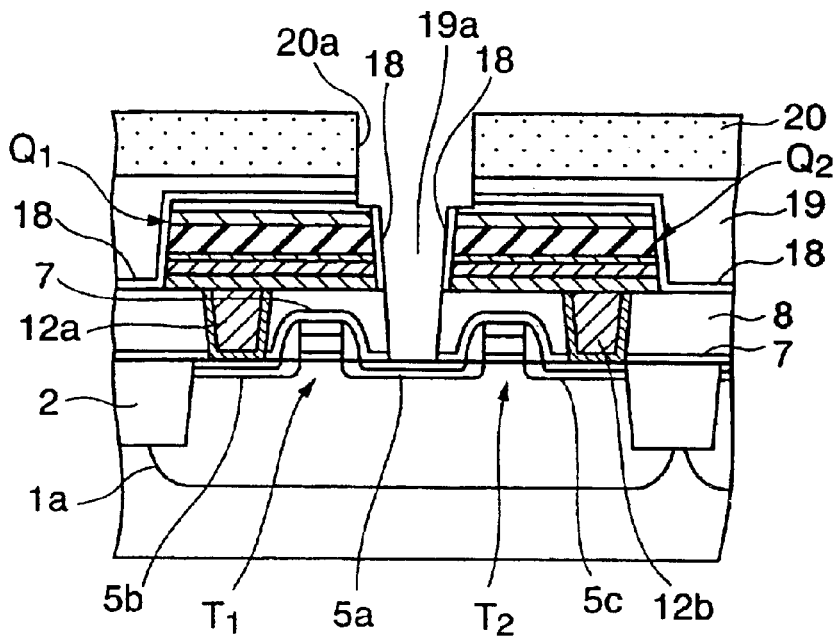

Then, as shown in FIG. 3I, a portion of the second capacitor protection film 18, which contacts to the upper surface of the first interlayer insulating film 8, is etched via the opening portion 20a in the resist 20 and the upper portion of the third contact hole 19a by using the fluorine reaction gas. Subsequently, the first interlayer insulating film 8 and the cover insulating film 7 under the third contact hole 19a are etched. Thus, a lower portion of the third contact hole 19a is formed. As a result, the first n-type impurity diffusion region 5a is exposed via the third contact hole 19a.

The third contact hole 19a is formed in a self-alignment manner while using the capacitor protection films 16, 18 on the upper surfaces and the side surfaces of the capacitors $Q_1$, $Q_2$ as a part of mask. Thus, the third contact hole 19a is positioned substantially by the capacitors $Q_1$, $Q_2$.

Therefore, even if the position of the opening portion 20a in the resist 20 is deviated, at least on one side of the position and the shape of the third contact hole 19a can be controlled by the capacitor $Q_1$ or the capacitor $Q_2$ on such one side and the overlying capacitor protection films 16, 18. In the etching step of forming such third contact hole 19a, the etching conditions are set such that the first and second interlayer insulating films 8, 19 can be etched with respect to the capacitor protection films 16, 18 with the good selectivity.

For example, following etching conditions are set if the interlayer insulating film is formed of $SiO_2$ formed by using TEOS (referred to as "$TEOS-SiO_2$" hereinafter) and the capacitor protection film is formed of alumina.

For example, in the parallel-plate etching equipment, the selective etching ratio of the $TEOS-SiO_2$ film to the alumina film can be set to about 7 by setting the degree of vacuum of the etching atmosphere to 46 Pa and setting the RF power to 1000 W at 13.56 MHz while using $C_4F_8$, Ar, and $CF_4$ as the etching gas.

Accordingly, after the upper portion of the third contact hole 19a is opened by etching the second interlayer insulating film 19, the first and second capacitor protection films 16, 18 that are exposed from the third contact hole 19a on the upper electrode 15a are etched by a depth of about 120 nm from the top and are left by a thickness of 100 to 200 nm. Also, the second capacitor protection film 18 formed on the side walls of the first and second capacitors $Q_1$, $Q_2$ is etched vertically. Therefore, the film thickness in the lateral direction is seldom reduced, and thus the state that the side surfaces of the first and second capacitors $Q_1$, $Q_2$ are covered with the second capacitor protection film 18 can be still maintained. In other words, the thickness of the second capacitor protection film 18 is formed to hold the state that the second capacitor protection film 18 can still cover the side surfaces of the first and second capacitors $Q_1$, $Q_2$ after the formation of the third contact hole 19a is completed. In addition, not only the thicknesses of the first and second capacitor protection films 16, 18 but also the etching conditions are set such that, in the situation that the third contact hole 19a is completely formed, at least the first capacitor protection film 16 remains on the upper surfaces of the capacitors $Q_1$, $Q_2$ and also the second capacitor protection film 18 remains on the side surfaces of the capacitors $Q_1$, $Q_2$.

As a result, the state that the capacitors $Q_1$, $Q_2$ are covered with the capacitor protection films 16, 18 can be still held after the formation of the third contact hole 19a is finished.

The alumina film has the high blocking property against the reducing atmosphere (hydrogen, etc.), which degrades the capacitors $Q_1$, $Q_2$ as described above, and also the selective etching ratio of the alumina film to the TEOS-$SiO_2$ film can be made small. Therefore, such alumina film is one of effective materials as the capacitor protection film. In case PZT, PLZT, or titanium oxide in addition to alumina is applied as the material constituting the capacitor protection films 16, 18, the thicknesses and the etching conditions are set like the above.

Since the capacitor protection films 16, 18 becomes thin on the portion which is exposed from the third contact hole 19a but becomes thick on other portions, the level difference occurs between the inside of the third contact hole 19a and its peripheral area on the upper electrode 15a.

Figure 3J:
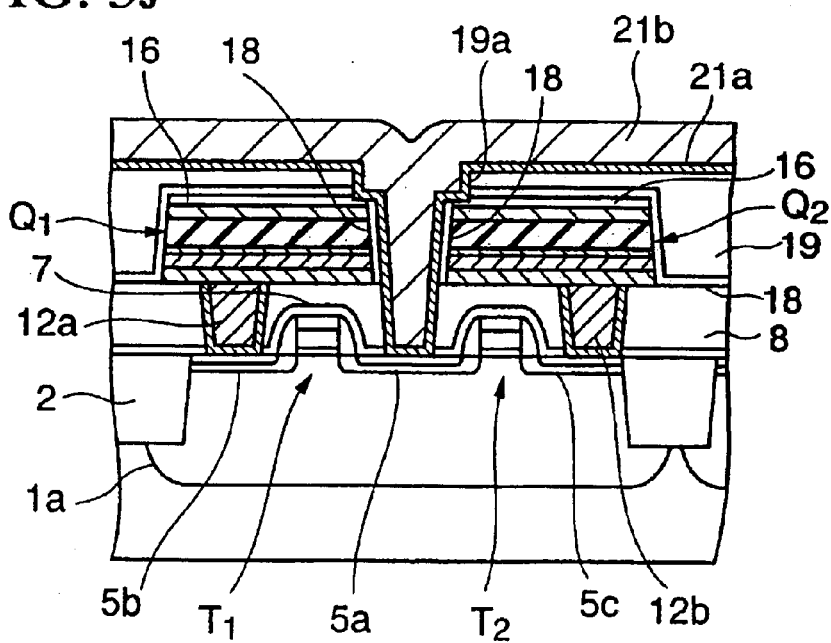

Then, as shown in FIG. 3J, the resist 20 is removed and then a titanium nitride film of 50 nm thickness is formed as a glue film 21a on the second interlayer insulating film 19 and in the third contact hole 19a by the sputter method. Then, the third contact hole 19a is buried completely by growing a tungsten film 21b on the glue film 21a by virtue of the CVD method using the tungsten hexafluoride ($WF_6$) gas.

Figure 3K:
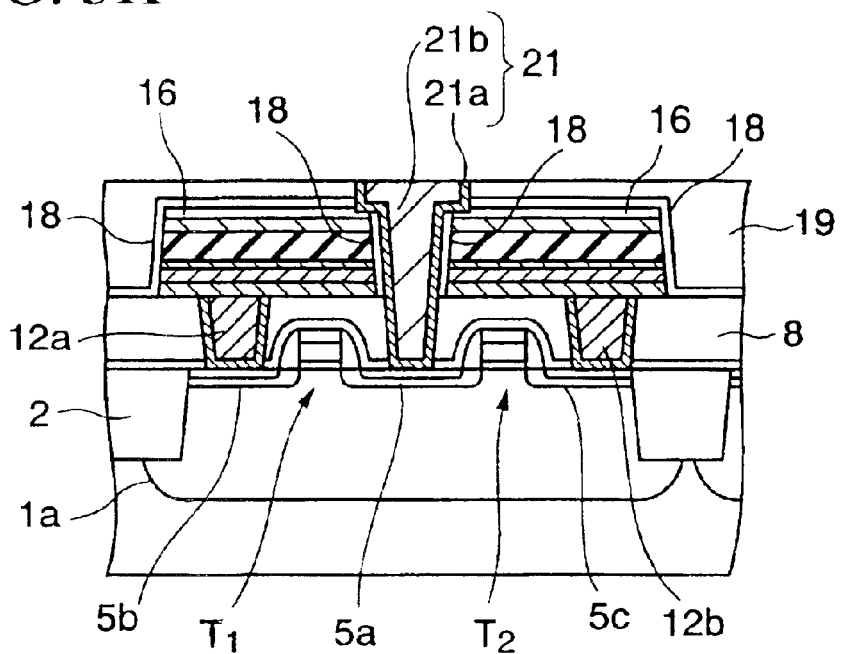

Then, as shown in FIG. 3K, the tungsten film 21b and the glue film 21a are polished by the CMP method to remove from the upper surface of the second interlayer insulating film 19. Accordingly, the tungsten film 21b and the glue film 21a left in the third contact hole 19a are used as the third conductive plug 21 that is connected the first n-type impurity diffusion region 5a.

In addition, the second interlayer insulating film 19 is annealed at 350° C. for 120 seconds in the nitrogen atmosphere.

Next, steps required to form a structure shown in FIG. 3L will be explained hereunder.

First, an oxidation preventing film 22 made of SiON and having a thickness of 100 nm is formed on the second interlayer insulating film 19 and the third conductive plug 21.

Then, holes 23b, 23c are formed on the upper electrodes 15a, 15b of the capacitors $Q_1$, $Q_2$ by patterning the oxidation preventing film 22, the second interlayer insulating film 19, and the capacitor protection films 16, 18 by virtue of the photolithography method. The capacitors $Q_1$, $Q_2$ that are damaged by the formation of the holes 23b, 23c are recovered by the annealing. This annealing is carried out in the oxygen-containing atmosphere at the substrate temperature of 550° C. for 60 minutes, for example.

Then, the oxidation preventing film 22 formed on the second interlayer insulating film 19 is removed by the etching back.

Next, steps required to form a structure shown in FIG. 3M will be explained hereunder.

First, a multi-layered metal film is formed in the holes 23b, 23c on the upper electrodes 15a, 15b of the capacitors $Q_1$, $Q_2$ and on the second interlayer insulating film 19. As this multi-layered metal film, for example, a Ti film of 60 nm thickness, a TiN film of 30 nm thickness, an Al—Cu film of 400 nm thickness, a Ti film of 5 nm thickness, and a TiN film of 70 nm thickness are formed sequentially.

Then, the multi-layered metal film is patterned, whereby first-layer metal wirings 24b, 24c, which are connected to the upper electrodes 15a, 15b of the capacitors $Q_1$, $Q_2$ via the holes 23b, 23c in the memory cell region, are formed and at the same time a conductive pad 24a connected to the third conductive plug 21 is formed.

In order to prevent the reduction of the pattern precision by the reflection of the exposure light in patterning the multi-layered metal film, a reflection preventing film (not shown) made of silicon oxide nitride (SiON) may be formed on the multi-layered metal film.

Then, a third interlayer insulating film 25 is formed on the second interlayer insulating film 19, the first-layer metal wirings 24b, 24c, and the conductive pad 24a, then a via hole 25a is formed on the conductive pad 24a, then a fourth conductive plug 26 is formed in the via hole 25a, and then a bit line 27 that is connected to an upper surface of the fourth conductive plug 26 is formed on the third interlayer insulating film 25. The bit line 27 is connected electrically to the first n-type impurity diffusion region 5a via the third and fourth conductive plugs 21, 26 and the conductive pad 24a.

A positional relationship among the capacitors $Q_1$, $Q_2$, the gate electrodes 5a, 5b, the p-type well 1a, and the first to third contact holes 8b, 8c, 19a in the above memory cell region, if illustrated as a plan view, is shown in FIG. 4. The first and second conductive plugs 12a, 12b are formed in the first and second contact holes 8b, 8c respectively, and also the third conductive plug 21 is formed in the third contact hole 19a.

In FIG. 4, the portion in which only the conductive plug 21 between two gate electrodes 4a, 4b, which pass through over one p-type well 1a, and the second capacitor protection film 18 on both sides of the plug are formed are present between the capacitor $Q_1$ and the capacitor $Q_2$ formed on one p-type well 1a. In other words, the portion in which the capacitors $Q_1$, $Q_2$ and the third conductive plug 21 are insulated only by the second capacitor protection film 18 is present over one p-type well 1a. This is because, as shown in FIGS. 3G to 3I, the third contact hole 19a is formed by using the opening portion 20a in the resist 20, the capacitors $Q_1$, $Q_2$, and the capacitor protection films 16, 18 as a mask.

Figure 1A:
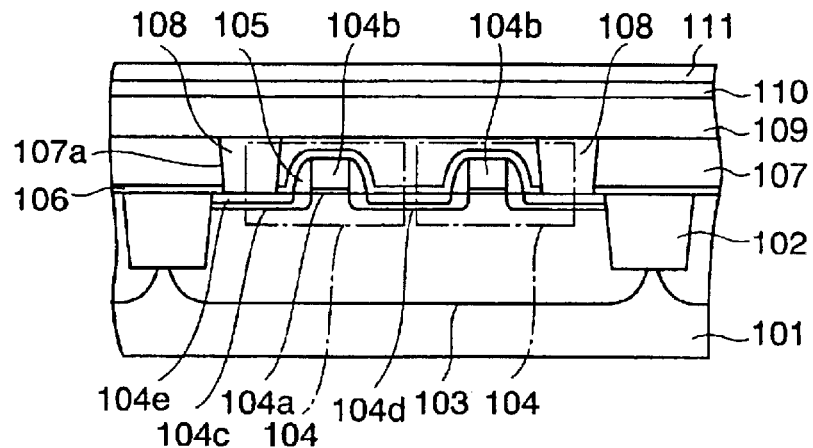
FIGS. 1A to 1D are sectional views showing steps of forming a semiconductor device in the prior art.
Figure 1B:
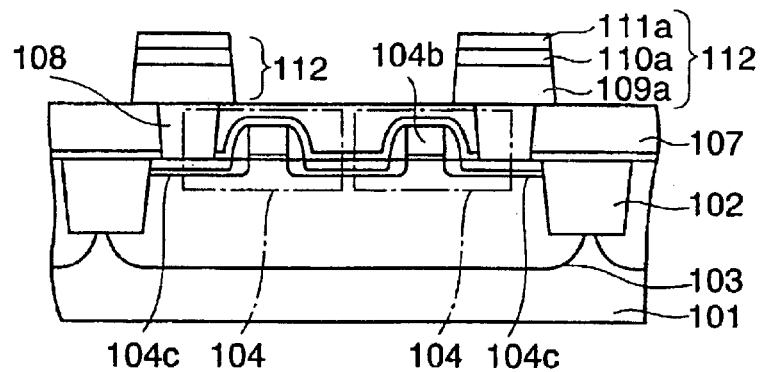
Figure 1C:
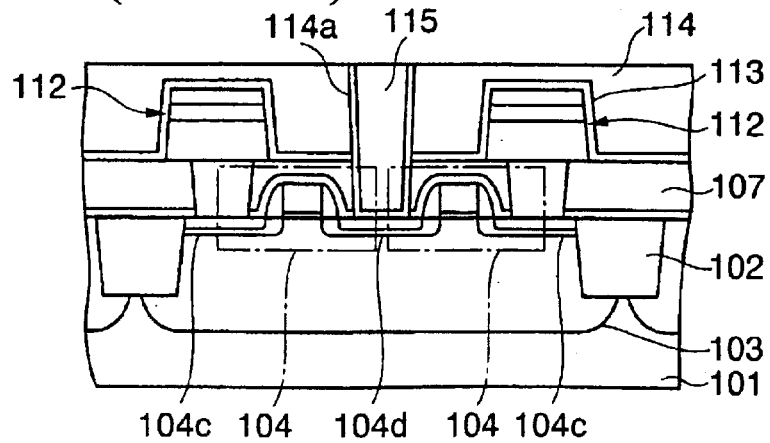
Figure 1D:
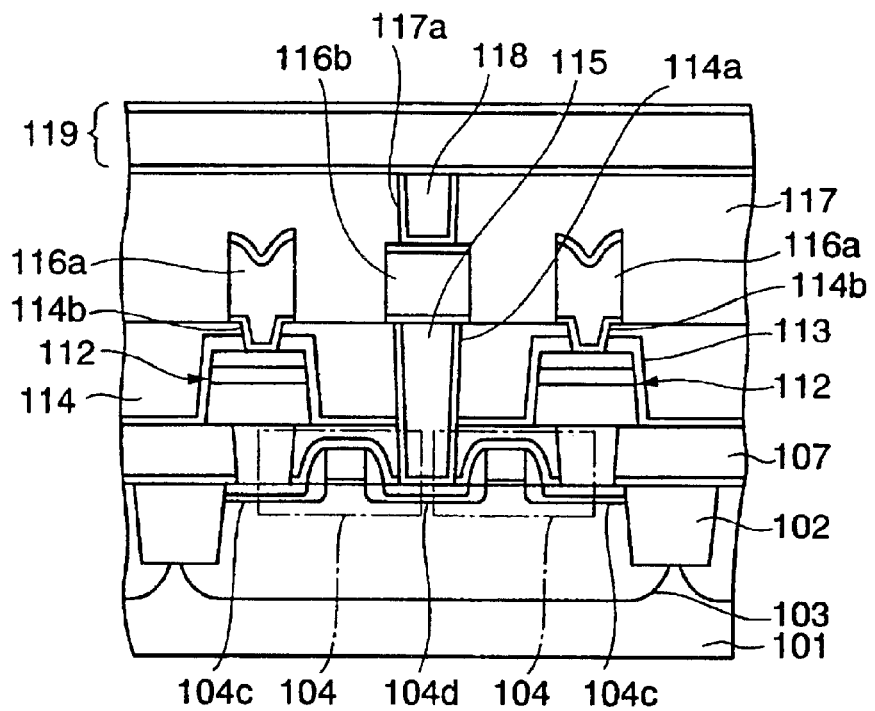
Figure 2:
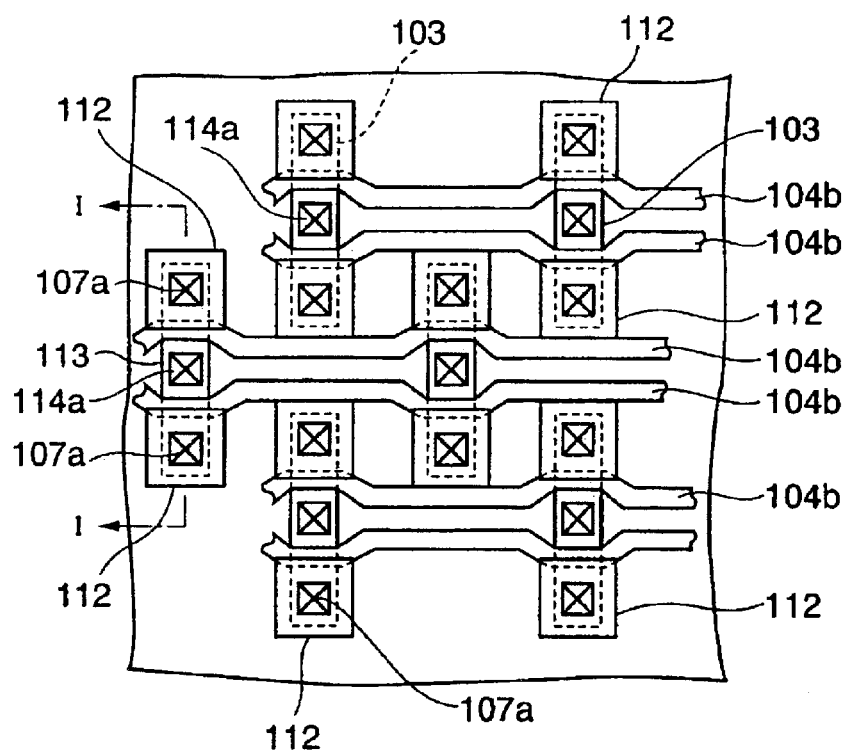
FIG. 2 is a plan view showing an arrangement of transistors and capacitors in a memory cell region of the semiconductor device in the prior art.

Therefore, the capacitors $Q_1$, $Q_2$ in the present embodiment are formed to extend largely toward the third contact hole 19a in contrast to the capacitor 112 having the conventional structure shown in FIG. 2. As a result, the capacitance of the capacitor can be increased larger than the prior art even if the miniaturization of the FeRAM memory cell makes progress.

In the planar shape of the capacitor 112 in the prior art shown in FIG. 2, for example, widths of the gate electrodes 104a, 104b in the extending direction are set to 0.7 μm and also lengths of the gate electrodes 104a, 104b in the direction perpendicular to the extending direction are set to 0.7 μm. In this case, as the alignment margin to form the contact hole 114a for the bit line contact, 0.2 μm must be assured between the contact hole 114a and the capacitors 112 formed on both sides of the contact hole 114a respectively. If a diameter of the contact hole 114a is set to 0.28 μm, the interval between the capacitors must be assured by at least 0.68 μm.

Assume that the capacitors $Q_1$, $Q_2$ shown in FIG. 4 are formed by using the same design rule as that in FIG. 2. In this case, there is no necessity to assure the alignment margin that is used to form the contact hole 19a. If the diameter of the third contact hole 19a for the bit line contact formed between the capacitors $Q_1$, $Q_2$ is set to 0.28 μm and the thickness of the second capacitor protection film 18 on the side surfaces of the capacitors $Q_1$, $Q_2$ is set to about 50 nm, the interval between the capacitors $Q_1$, $Q_2$ is given by 0.38 μm. This interval becomes considerably narrow rather than the prior art. Accordingly, in the planar shape of the capacitors $Q_1$, $Q_2$ according to the present embodiment, widths of the gate electrodes 4a, 4b in the extending direction are set to 0.70 μm and also lengths of the gate electrodes 4a, 4b in the direction perpendicular to the extending direction are set to about 0.85 μm, whereby the area can be increased by 20 to 30% rather than the prior art.

By the way, after the third contact hole 19a is formed completely in the region between the capacitors $Q_1$, $Q_2$ as described above, the side surfaces and the upper surfaces of the capacitors $Q_1$, $Q_2$ around the third contact hole 19a must be covered perfectly with the capacitor protection films 16, 18.

For this reason, the thickness of the first capacitor protection film 16 required to function as the capacitor protection film must be kept after the etching that is applied to form the third contact hole (bit-line contact hole) 19a has been executed.

The thickness $T_{encap}$ of the capacitor protection films 16, 18 is decided by the thickness of the capacitor protection films 16, 18 that is etched when the third contact hole 19a is formed, the selective etching ratio of the capacitor protection films 16, 18, and the thickness necessary for the capacitor protection, and can be expressed by a following Eq.(1).

$$T_{encap} = (T_{insulate} \times ER_{encap} \times ER_{insulate}) + T_{protect} \quad (1)$$

Where $T_{insulate}$ is a thickness (nm) of the interlayer insulating films 8, 19, $ER_{encap}$ is an etching rate (nm/min) of the capacitor protection films 16, 18, $ER_{insulate}$ is an etching rate (nm/min) of the interlayer insulating films 8, 19, and $T_{protect}$ is a thickness of the capacitor protection films 16, 18 necessary for the capacitor protection.

Meanwhile, when the capacitor protection film 18 is removed from the bottom of the third contact hole 19a by selectively executing the etching in the state shown in FIG. 3H, the capacitor protection film 18 on the first interlayer insulating film 8 must be etched between the capacitors $Q_1$, $Q_2$. In this case, it is possible that the capacitor protection film 18 on the side surfaces of the capacitors $Q_1$, $Q_2$ becomes excessively thin by the etching. Thus, there is such a possibility that, if the thickness of the capacitor protection film 18 on the side surfaces of the capacitors $Q_1$, $Q_2$ becomes too small, the capacitors $Q_1$, $Q_2$ cannot be sufficiently isolated from the reducing atmosphere.

Therefore, as described in the following, as shown in FIG. 3F, after the second capacitor protection film 18 is formed, such second capacitor protection film 18 formed on the upper surface of the first interlayer insulating film 8 between the capacitors $Q_1$, $Q_2$ may be removed. An example of this will be explained hereunder.

First, as shown in FIG. 3F, the second capacitor protection film 18 is formed on the upper surfaces and the side surfaces of the capacitors $Q_1$, $Q_2$ and on the upper surface of the first interlayer insulating film 8. The second capacitor protection film 18 is formed to have a thickness of 100 nm on the upper surface of the capacitors $Q_1$, $Q_2$ and on the side surfaces of the capacitors $Q_1$, $Q_2$, for example.

Figure 5A:
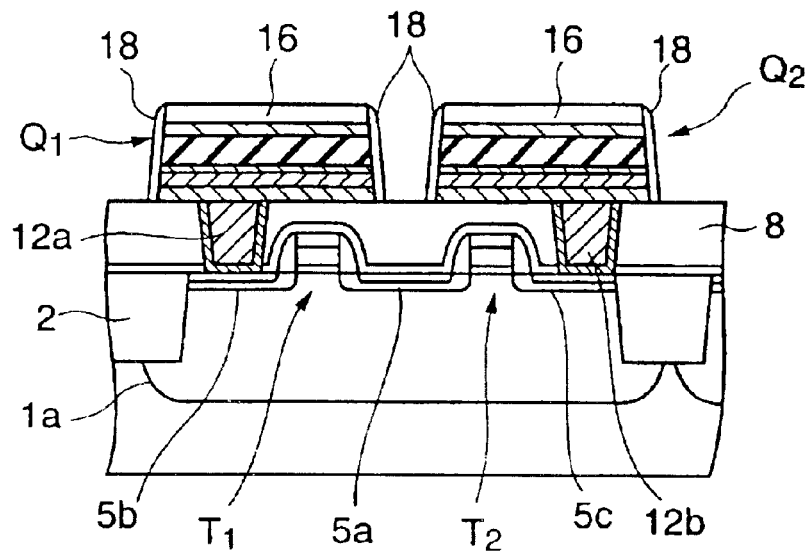
FIGS. 5A to 5E are sectional views showing another steps of manufacturing a semiconductor device according to an embodiment of the present invention.

Then, as shown in FIG. 5A, the second capacitor protection film 18 is etched vertically to the substrate surface such that such second capacitor protection film 18 is removed from the upper surfaces of the first interlayer insulating film 8 and the first capacitor protection film 16 respectively but is left to cover completely the side surfaces of the capacitors $Q_1$, $Q_2$. In this state, the exposed area of the first interlayer insulating film 8 exists between the capacitors $Q_1$, $Q_2$.

In this case, the thickness $T_{encap}$ of the first capacitor protection film 16 on the capacitors $Q_1$, $Q_2$ is formed thicker than the thickness that is calculated based on above Eq.(1) with regard to the excessive etching of the second capacitor protection film 18. Also, since the second capacitor protection film 18 is removed from the upper surface of the first capacitor protection film 16, the first capacitor protection film 16 is formed previously thicker than that in the above embodiment, e.g., to have a thickness of about 220 to 320 nm.

Figure 5B:
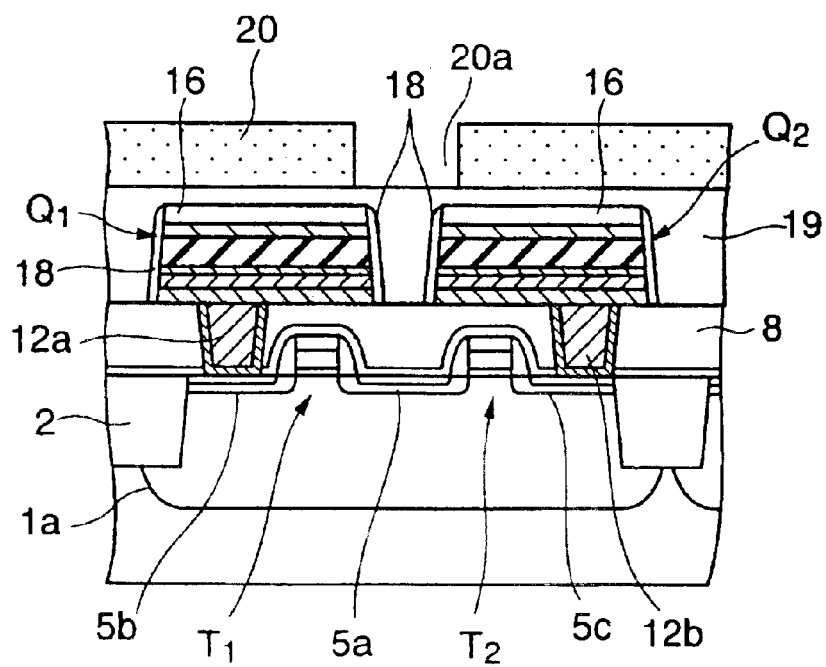

Next, steps required to form a structure shown in FIG. 5B is explained hereunder.

First, the $SiO_2$ film as the second interlayer insulating film 19 is formed on the second capacitor protection film 18 and the first interlayer insulating film 8 under the same conditions as those in the first embodiment. Then, the upper surface of the second interlayer insulating film 19 is made flat by the CMP method. In this example, the remaining thickness of the second interlayer insulating film 19 after the CMP is set to about 300 nm over the upper electrodes 15a, 15b and set to about 800 nm on the first interlayer insulating film 8 on the side of the capacitors $Q_1$, $Q_2$.

Then, the resist 20 is coated on the second interlayer insulating film 19, and then the opening portion 20a used to form the contact hole is formed in the resist 20 between the capacitors $Q_1$, $Q_2$, which are formed over one p-type well 1a, by exposing/developing the resist 20. This opening portion 20a may be formed to have the diameter that is larger than the interval between the capacitors $Q_1$, $Q_2$ in view of the alignment displacement.

Figure 5C:
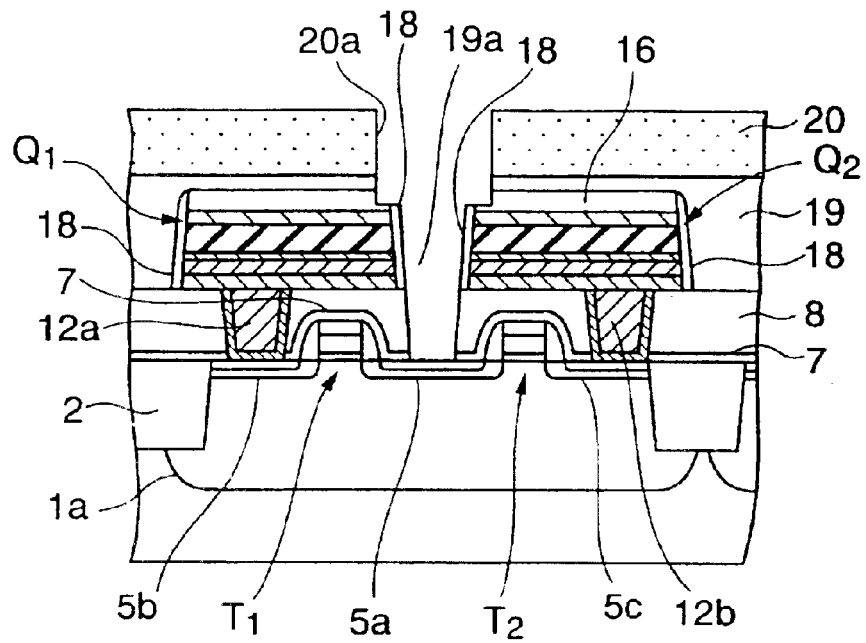

Then, as shown in FIG. 5C, the third contact hole 19a is formed in a self-alignment manner by applying the anisotropic etching to the second interlayer insulating film 19, the first interlayer insulating film 8, and the transistor protection film 7 via the opening portion 20a of the resist 20 in the vertical direction. Accordingly, the first n-type impurity diffusion region 5a is exposed via the third contact hole 19a. Then, the resist 20 is removed.

In the etching step of forming such third contact hole 19a, the etching conditions are set such that the first interlayer insulating film 8, the second interlayer insulating film 19, and the transistor protection film 7 can be etched with respect to the capacitor protection films 16, 18 with the good selectivity. For example, if the first and second interlayer insulating films 8, 19 are formed of $SiO_2$ and the capacitor protection films 16, 18 are formed of alumina, the selective etching ratio of the $SiO_2$ film to the alumina film can be set to about 7 by setting the degree of vacuum of the etching atmosphere to 46 Pa and setting the RF power to 1000 W at 13.56 MHz while using $C_4F_8$, Ar, and $CF_4$ as the etching gas in the parallel-plate etching equipment.

Figure 5D:
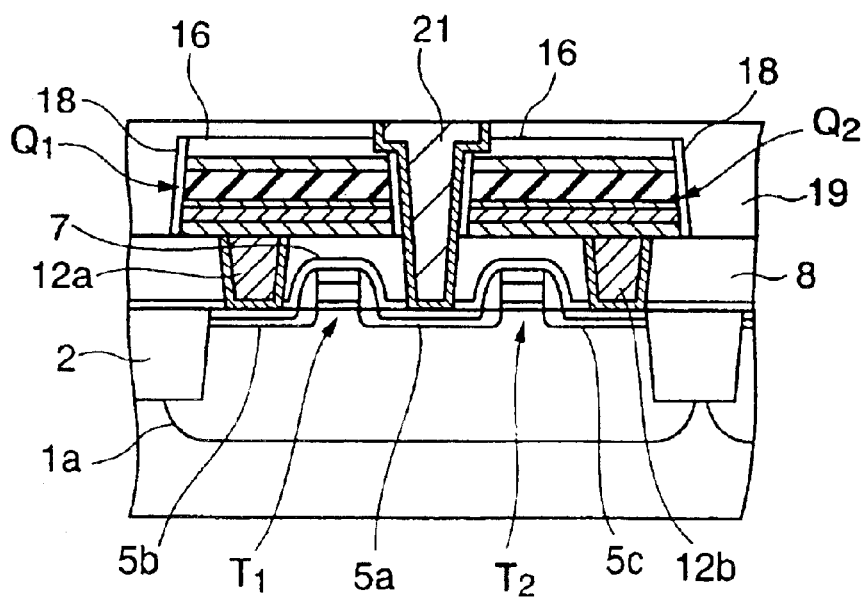

Then, as shown in FIG. 5D, the third conductive plug 21 is formed in the third contact hole 19a. This third conductive plug 21 is formed by the above-mentioned method.

Then, the second interlayer insulating film 19 is annealed in the nitrogen atmosphere at 350° C. for 120 seconds.

Figure 5E:
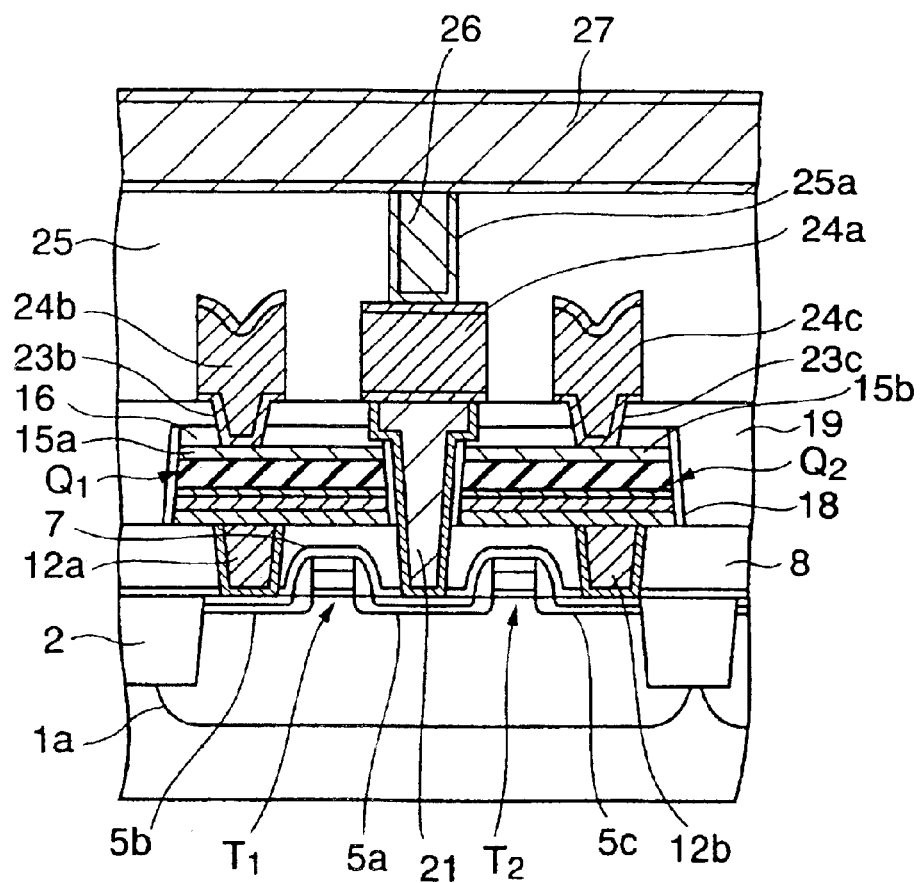

Next, steps required to form a structure shown in FIG. 5E will be explained hereunder.

Figure 3L:
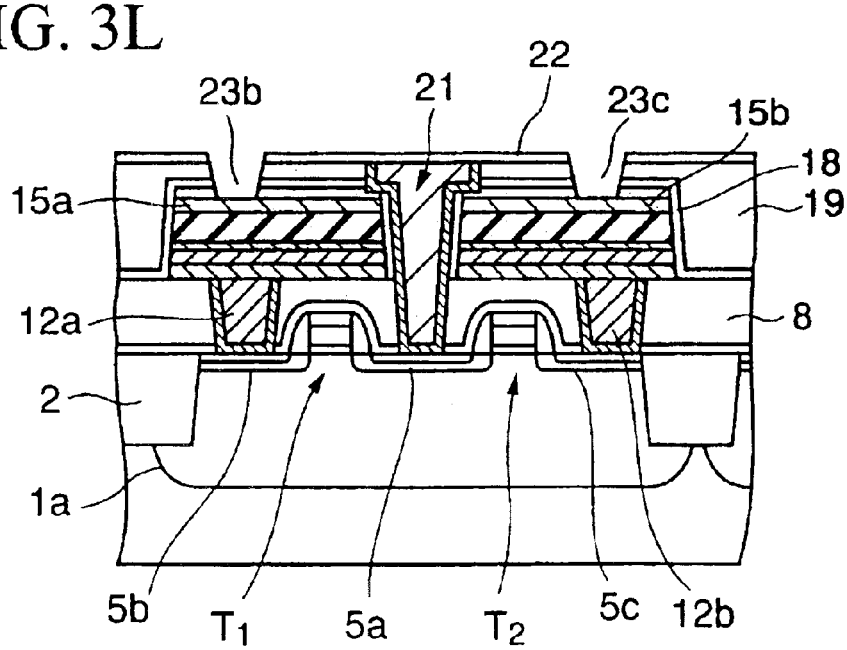

First, the holes 23b, 23c are formed on the upper electrodes 15a, 15b of the capacitors $Q_1$, $Q_2$ in compliance with the steps shown in FIG. 3L. The capacitors $Q_1$, $Q_2$ that are subjected to the damage caused by the formation of the holes 23b, 23c are recovered from the damage by the oxygen annealing. In this case, the oxidation preventing film formed on the second interlayer insulating film 19 is removed.

Figure 3M:
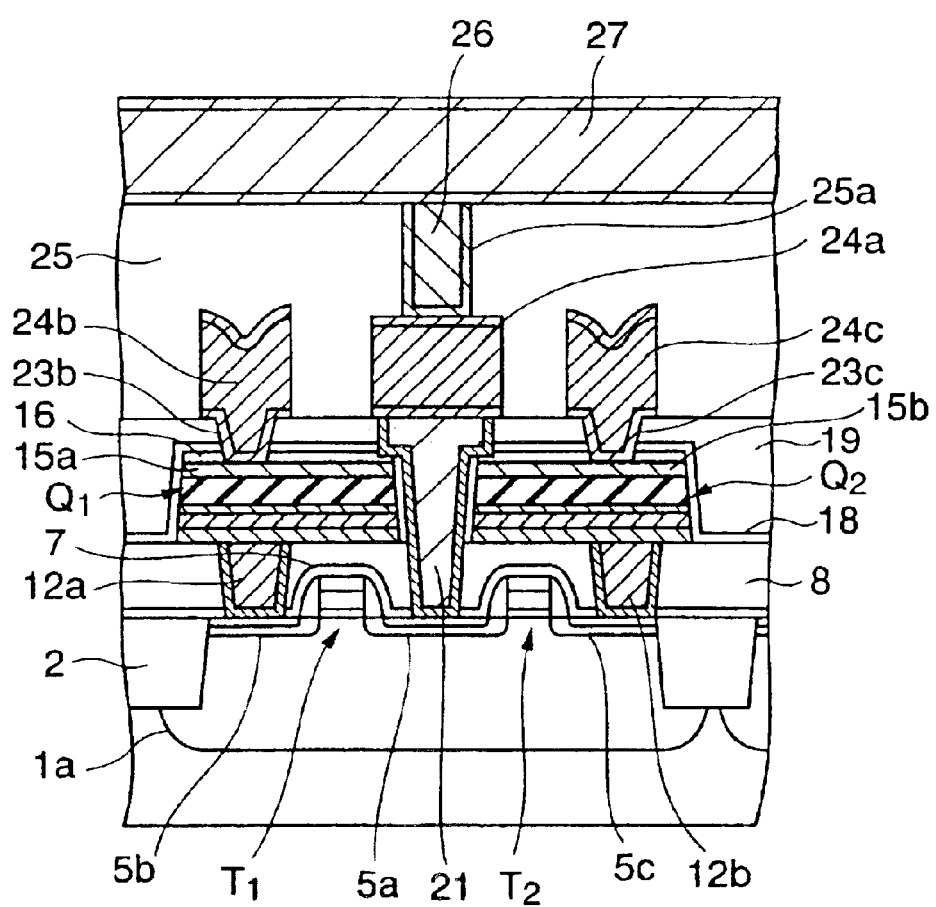

Then, in compliance with the steps shown in FIG. 3M, the first-layer metal wirings 24b, 24c, which are connected to the upper electrodes 15a, 15b of the capacitors $Q_1$, $Q_2$ via the holes 23b, 23c in the memory cell region, are formed and at the same time the conductive pad 24a connected to the third conductive plug 21 is formed.

Then, the third interlayer insulating film 25 is formed on the second interlayer insulating film 19, the first-layer metal wirings 24b, 24c, and the conductive pad 24a, then the via hole 25a is formed on the conductive pad 24a, then the fourth conductive plug 26 is formed in the via hole 25a, and then the bit line 27 that is connected to the upper surface of the fourth conductive plug 26 is formed on the third interlayer insulating film 25.

According to the steps shown in FIGS. 5A to 5E, in the step of forming the third contact hole 19a in the first and second interlayer insulating film 19 and the transistor protection film 7, the second capacitor protection film 18 does not exist on the upper bottom of the third contact hole 19a formed in the second interlayer insulating film 19. Therefore, in forming the third contact hole 19a, there is no necessity to etch the second capacitor protection film 18 that crosses the third contact hole 19a. As a result, it can be prevented that the second capacitor protection film 18 on the side surfaces of the capacitors is excessively thinned, and also the formation of the third contact hole 19a can be facilitated.

In the above embodiments, the steps of forming the third contact hole 19a subsequently to the first and second interlayer insulating films 8, 19 and then forming one conductive plug 21 in the third contact hole 19a are explained. However, the third contact hole 19a may be formed separately from the first interlayer insulating film 8 and the second interlayer insulating film 19. More particularly, the contact hole may be formed in the first interlayer insulating film 8 over the first n-type impurity diffusion region 5a, then the first-layer conductive plug for the bit-line contact may be formed in the contact hole, then the capacitors $Q_1$, $Q_2$ may be formed on the first interlayer insulating film 8, then the capacitor protection films 16, 18 and the second interlayer insulating film 19 may be formed, then the contact hole may be formed over the first-layer conductive plug to pass through the second interlayer insulating film 19 and the capacitor protection films 16, 18, and then the second-layer conductive plug for the bit-line contact may be formed in the contact hole. In this case, the bit line 27 is connected electrically to the first n-type impurity diffusion region 5a via the first layer and second-layer conductive plugs.

As described above, according to the present invention, the upper surface and the side surfaces of the ferroelectric capacitor formed on the first insulating film are covered with the capacitor protection film, and also the holes formed in the second insulating film, which is formed on the capacitor protection film and the first insulating film, are positioned next to the side surfaces of the capacitor via the capacitor protection film. Therefore, the interval between the ferroelectric capacitor and the contact hole becomes equal to the thickness of the capacitor protection film, and thus the capacitor area can be increased wider than the prior art by setting the formation region of the ferroelectric capacitor closer to the hole side.

In addition, since the material of the capacitor protection film is selected such that the second insulating film can be etched selectively from the capacitor protection film, the hole is formed in the second insulating film to come into contact with the capacitor protection film on the side surfaces of the ferroelectric capacitor and also the conductive plug is formed in the hole. Therefore, the alignment of the hole can be executed in a self-alignment fashion by using the capacitor protection film on the surface of the ferroelectric capacitor, and it is not needed to assure widely the alignment margin for the hole formation, and the hole formation can be facilitated.

What is claimed is:

1. A method of manufacturing a semiconductor device comprising the steps of:

forming a first impurity diffusion region in a semiconductor substrate;

forming a first insulating layer over the semiconductor substrate;

forming a first conductive layer, a ferroelectric layer, and a second conductive layer over the first insulating layer;

forming a capacitor by patterning the second conductive layer, the ferroelectric layer, and the first conductive layer using a first mask;

forming an insulating capacitor protection layer made of material, which is different from the first insulating layer, on an upper surface and side surfaces of the capacitor;

forming a second insulating layer made of material, that is etched selectively from the capacitor protection layer, over the capacitor protection layer and the first insulating layer;

forming a first hole, which comes into contact with the capacitor protection layer on the side surface of the capacitor, in the second insulating layer; and forming a first conductive plug, which is connected electrically to the first impurity diffusion region, in the first hole.

2. A method of manufacturing a semiconductor device according to claim 1, wherein the first hole is extended into the first insulating layer.

3. A method of manufacturing a semiconductor device according to claim 1, wherein two capacitors consisting of the capacitor are formed at an interval over the first impurity diffusion region, and the first hole is formed between two capacitors in a self-alignment manner using the capacitor protection layers on upper surfaces and side surfaces of the capacitors.

4. A method of manufacturing a semiconductor device according to claim 3, wherein the first hole is formed by etching the second insulating layer through an opening portion of a second mask formed over the second insulating layer, and the opening portion of the second mask has a diameter that is larger than an interval between two capacitors.

5. A method of manufacturing a semiconductor device according to claim 1, wherein the capacitor protection layer is formed by steps of forming a first protection insulating layer on the second conductive layer, patterning the first protection insulating layer by using the first mask as well as the first conductive layer, the ferroelectric layer, and the second conductive layer, and forming a second protection insulating layer on the first protection insulating layer and the side surface of the capacitor.

6. A method of manufacturing a semiconductor device according to claim 5, further comprising the step of applying an anisotropic etching to the second protection insulating layer to remove the second protection insulating layer from an upper surface of the first insulating layer around the capacitor and leave the second protection insulating layer on the side surface of the capacitor.

7. A method of manufacturing a semiconductor device according to claim 1, further comprising the step of forming the first hole in the capacitor protection layer that extends from the capacitor onto the first insulating layer.

8. A method of manufacturing a semiconductor device according to claim 1, further comprising the steps of:

forming a second impurity diffusion region in the semiconductor substrate simultaneously with the first impurity diffusion region;

forming a second hole in the first insulating layer under the lower electrode of the capacitor; and forming a second conductive plug, which is connected electrically to the second impurity diffusion region, in the second hole.

9. A method of manufacturing a semiconductor device according to claim 8, further comprising the step of forming a gate electrode over the semiconductor substrate between the first impurity diffusion region and the second impurity diffusion region via a gate insulating layer.

10. A method of manufacturing a semiconductor device according to claim 1, wherein the step of forming the capacitor protection insulating layer is the step of forming one of alumina, PZT material, and titanium oxide.

* * * * *